United States Patent
Konrad et al.

(10) Patent No.: US 6,455,139 B2
(45) Date of Patent: Sep. 24, 2002

(54) PROCESS FOR REDUCING EXTRANEOUS METAL PLATING

(75) Inventors: John Joseph Konrad; Konstantinos I. Papathomas, both of Endicott; Timothy Leroy Wells, Apalachin; James Warren Wilson, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/917,701

(22) Filed: Jul. 31, 2001

Related U.S. Application Data

(62) Division of application No. 09/133,029, filed on Aug. 12, 1998, now Pat. No. 6,296,897.

(51) Int. Cl.[7] ................................................. B32B 3/00
(52) U.S. Cl. ........................ 428/209; 174/257; 174/250
(58) Field of Search .......................... 428/209; 174/257, 174/250

(56) References Cited

U.S. PATENT DOCUMENTS

| | | | | |
|---|---|---|---|---|
| 4,812,275 A | | 3/1989 | Yumoto | 264/129 |
| 4,874,635 A | | 10/1989 | Karas et al. | 427/96 |
| 4,940,181 A | * | 7/1990 | Juskey, Jr. et al. | 228/180.2 |
| 5,202,151 A | * | 4/1993 | Ushio et al. | 427/98 |
| 5,235,139 A | * | 8/1993 | Bengston et al. | 174/257 |
| 5,252,195 A | * | 10/1993 | Kobayashi et al. | 205/126 |
| 5,468,515 A | | 11/1995 | Ferrier et al. | 427/98 |
| 5,591,488 A | | 1/1997 | Schafer et al. | 427/307 |
| 5,648,125 A | | 7/1997 | Cane | 427/534 |
| 5,817,405 A | * | 10/1998 | Bhatt et al. | 428/209 |

* cited by examiner

*Primary Examiner*—Cathy Lam
(74) *Attorney, Agent, or Firm*—Connolly Bove Lodge & Hutz; Lawrence R. Fraley

(57) ABSTRACT

Printed circuit boards, cards and chip carriers are fabricated by treating an already circuitized substrate with a swelling agent, then treating the circuitized substrate with a composition containing an alkaline permanganate, a chromate and/or chlorite and then applying a metal layer to coat the circuitized portion of the substrate.

20 Claims, No Drawings

PROCESS FOR REDUCING EXTRANEOUS METAL PLATING

CROSS-REFERENCE TO RELATED APPLICATION

This application is a divisional of U.S. patent application Ser. No. 09/133,029, filed Aug. 12, 1998, now U.S. Pat. No. 6,296,897.

TECHNICAL FIELD

The present invention relates to a method for fabricating printed circuit boards, cards and chip carriers and is especially directed to a method for plating a metal layer on the circuitized portions of an already circuitized substrate. More particularly, the method of the present invention reduces bridging that can occur during the to plating.

BACKGROUND OF INVENTION

In the manufacture of printed circuit cards and boards, a dielectric sheet material is employed as the substrate. A conductive circuit pattern is provided on one or both of the major surfaces of the substrate. The conductive pattern can be formed on the surface of the substrate using a variety of known techniques. These known techniques include the subtractive technique, where a layer of for example copper is etched to form the desired circuit pattern, the EDB (electroless direct bond) technique, where copper is electrolessly plated directly on the surface of the substrate in the desired pattern, and the peel-apart technique, where the desired circuit pattern is plated up from a thin layer of peeled-apart copper. Since the substrate employed is a dielectric, when it is desired to plate directly on the surface of the substrate, various techniques for seeding or catalyzing the substrate are used.

Furthermore, in various situations, it is desirable to selectively plate on the metallic surfaces (usually copper) as opposed to the dielectric surfaces of the substrate. This is especially true for plating copper areas that are to be used for electrical connection. For example, it is common practice to overplate copper lines with a barrier layer, typically a metal such as nickel followed by a second overplating with a precious metal such as gold, palladium or rhodium. Examples of such processes are disclosed in U.S. Pat. Nos. 4,940,181 and 5,235,139, disclosures of which are incorporated herein by reference.

However, there is a tendency for the nickel and/or precious metal to plate not only on the already present circuit lines, but also to deposit on a portion of the dielectric substrate or insulator located between lines. This problem is especially pronounced when dealing with very fine lines that are only separated by very small intervals. For example, circuit boards having surface conductive paths whose spacing is 50 microns or below have a tendency to suffer from bridging or short circuiting due to the subsequent plating of the nickel and/or precious metal. It would therefore be desirable to provide a process for plating only already circuitized lines whereby the problem of bridging is significantly reduced if not entirely eliminated.

SUMMARY OF INVENTION

The present invention is concerned with a method that significantly reduces the problem of extraneous plating in areas between circuitry on a circuitized substrate. More particularly, it has been found according to the present invention that treating an already circuitized substrate with a swelling agent and with a composition of an alkaline permanganate, a chromate or chlorite significantly reduces if not entirely eliminates the bridging problem. Accordingly, the method of the present invention relates to fabricating a printed circuit board which comprises providing a circuitized substrate and treating the circuitized substrate with a swelling agent. The substrate is then treated with a composition of an alkaline permanganate, a chromate or chlorite followed by applying a metal layer on the treated circuitized substrate to coat the circuitized portion of the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The process of the present invention is applicable to treating a variety of circuitized dielectric (non-conductor) substrates. Dielectric substrates described in the prior art, including thermoplastic and thermosetting resins, may be plated in accordance with the present invention.

Typical thermosetting polymeric materials include epoxy, phenolic base materials, and polyamides. Combinations of epoxies with cyanates, BT (bismalemide) resins or polyimides are also quite suitable. The dielectric materials may be molded articles of the polymers containing fillers and/or reinforcing agents, such as glass-filled epoxy or phenolic base materials. Examples of some phenolic type materials include copolymers of phenol, resorcinol and cresole. Examples of some suitable thermoplastic polymeric materials include polyolefins such a polypropylene, polysulfones, polycarbonates, nitrile rubbers, ABS polymers and fluorinated polymeric materials such as polytetrafluoroethylene.

More typically, the dielectric substrates employed are FR-4 epoxy compositions. A typical FR-4 epoxy composition contains 70–90 parts of brominated polyglycidyl ether of bisphenol-A and 10–30 parts of tetrakis (hydroxypenyl) ethane tetraglycidyl ether cured with 3 to 4 parts of dicyandiamide and 0.2 to 0.4 parts of a tertiary amine, all parts being parts by weight per 100 parts of resin solids.

Another typical FR-4 epoxy composition contains:

A) about 25 to about 30 parts by weight of a tetrabrominated diglycidyl ether of bisphenol-A, having an epoxy equivalent weight of about 350 to about 450;

B) about 10 to about 15 parts by weight of a tetrabrominated diglycidyl ether of bisphenol-A having an epoxy equivalent weight of about 600 to about 750; and C) about 55 to about 65 parts by weight of at least epoxidized non-linear novolak, having at least terminal epoxy groups, along with suitable curing and/or hardening agents.

Another typical FR-4 epoxy composition contains about 70 to about 90 parts of brominated polyglycidyl ether of bisphenol-A, and 10 to 30 parts of tetrakis (hydroxyphenyl) ethane tetraglycidyl ether cured with 0.8 to 1 part of 2-methyl imidazole.

Still another FR-4 epoxy composition employs tetrabromo bisphenol-A as curing agent, along with 2-methyl imidazole as the catalyst.

The desired pattern of circuit line is provided on the substrate employing any of the well known copper plating rs techniques. A typical example is a subtractive copper plating technique such as that disclosed in Principles of Electronic Packaging by Seraphim, Laski & Li, McGraw-Hill, 1989, disclosure of which is incorporated herein by reference. Other metals include nickel and cobalt.

Since the present invention is especially concerned with plated features that are relatively close to each other, the spacing between adjacent lines is typically about 75 microns or less, a particular example being about 28 microns.

According to the present invention, the now circuitized substrate is treated with a swelling agent. The swelling agent is typically an organic swelling agent and is usually present as a composition in order along with an alkaline reacting substance. Examples of suitable organic swelling material include monohydric alcohols, di- and polyhydric alcohols, ethers, cyclic ethers, lactones, and pyrrolidones. Suitable alcohols include methanol, ethanol, isopropanol, alkanol amines, 1,2,3-propane triol, 1-hexanol, ethylene glycol, ethanol amine, 1,6-hexane diol, triethylene glycol, 2,2-dimethyl-1,3-propane diol, 1,2-propane diol, 1,5-pentane diol, 1,4-butane diol, 1,3-butane diol and 1,2-butane diol.

Suitable ethers include propylene glycol monomethyl ether, propylene glycol monopropyl ether and diethylene glycol monobutyl ether (butyl "carbitol"). A suitable pyrrolidone includes N-methyl pyrrolidone and a suitable lactone includes gamma-butyrolactone.

Preferred swelling agents are butyl carbitol, ethylene glycol, N-methyl pyrrolidone, and y-butyrolactone.

The swelling agent is typically present in an aqueous composition at a concentration of about 5% to about 50% by volume and more typically about 10% to about 20% by volume. A typical butyl carbitol composition contains about 10 to about 20% by volume butyl carbitol.

In addition, according to preferred aspects of the present invention the swelling solution also includes an alkaline reacting material such as an alkali metal hydroxide such as sodium hydroxide. When present, the alkaline material is typically present in the composition in amounts of about 20 to about 80 grams/liter, and more typically about 40 to about 60 grams/liter.

The temperature of the swelling agent composition is typically at about 70 to about 80° C. during the treatment. The swelling composition according to the present invention can be brought into contact with the circuitized substrate to be treated in various ways. Normally, the circuitized substrate is dipped in the solution. Alternatively, the swelling solution can also be applied to the circuitized substrate by spraying, splashing or injecting.

Typically, the substrate is maintained in contact with the swelling solution for about 2 to about 15 minutes.

Next, the circuitized substrate is treated with a composition containing alkaline permanganate, or a chromate or a chlorite. In the case of permanganate composition, typically it is an aqueous solution that contains from about 20 to about 90 grams/liter, and more typically about 50 to about 70 grams/liter of the permanganate. The permanganate is typically potassium permanganate or sodium permanganate. Also the permanganate composition usually contains an alkali metal hydroxide such as sodium hydroxide or potassium hydroxide. Typical permanganate compositions contain about 50 to about 70 grams/liter of $NaMnO_4$ or $KMn_4$; about 40 to about 60 grams/liter of NaOH or KOH, with the remainder being water.

The treating composition according to the present invention can be brought into contact with the circuitized substrate in various ways. Normally, the circuitized substrate is dipped in the permanganate solution. Alternatively, the treating solution can also be applied to the circuitized substrate by spraying, splashing or injecting. When the treating solution is an alkaline permanganate, the solution is usually at a temperature of about 70 to about 80° C. during the contact. The contact with the treating composition is typically about 2 to about 20 minutes.

According to preferred aspects of the present invention, the substrate is also contacted with a reducing agent in a sufficient amount to neutralize any remaining alkaline material that has been used. The amount can be readily determined by those skilled in the art once aware of the present invention. Suitable reducing compositions include sulfuric acid/hydrogen peroxide solutions and other mild acids.

After the treatment, a metal layer is applied to the circuitized substrate to coat the circuitized portion of the substrate. It has been found according to the present invention that a significant reduction in extraneous plating is achieved by the above treatment according to the present invention.

Typically, the treated circuitized substrate is subjected to an electroless nickel plating composition such as nickel-boron or a nickel-phosphorous plating solution such as MacDermid Planar electroless nickel XD-626T or Atotech CNN electroless nickel. After this, the treated circuitized substrate is subjected to a precious metal plating solution such as an electroless gold, palladium, platinum or rhodium plating solution.

In addition, clean water rinses can be employed between the various steps discussed above. Moreover, according to preferred aspects of the present invention, a copper cleaning operation such as ENTEK is carried out on the treated circuitized substrate prior to applying the metal coating.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A fine-line circuitized substrate and chip carrier wherein said circuitized substrate contains metal lines spaced about 28 microns apart fabricated according to the method comprising:

providing a circuitized substrate comprising a circuitized portion and dielectric located between the circuitized portion;

contacting said circuitized substrate with a swelling agent for treating said dielectric;

contacting said circuitized substrate with a composition comprising at least one member selected from the group consisting of alkaline permanganate, chromate, and chlorite for treating said dielectric; and applying a metal layer on said treated circuitized substrate to coat the circuitized portion of said substrate.

2. The fine line circuitized substrate and chip carrier of claim 1 wherein said circuitized substrate contains copper lines.

3. The fine line circuitized substrate and chip carrier of claim 1 wherein said swelling agent is present in a swelling composition that contains water and an alkaline reacting material.

4. The fine line circuitized substrate and chip carrier of claim 3 wherein said swelling agent is selected from the group consisting of alcohols, ethers, cyclic ethers, pyrrolidones and lactones.

5. The fine line circuitized substrate and chip carrier of claim 4 wherein the amount of said swelling agent in said composition is about 5% to about 50% by volume.

6. The fine line circuitized substrate and chip carrier of claim 3 wherein said alkaline material is sodium hydroxide.

7. The fine line circuitized substrate and chip carrier of claim 1 wherein said composition comprises an alkaline permanganate.

8. The fine line circuitized substrate and chip carrier of claim 7 wherein said alkaline permanganate is sodium permanganate or potassium permanganate.

9. The fine line circuitized substrate and chip carrier of claim 1 wherein said metal layer is provided by electrolessly depositing a nickel layer followed by electrolessly depositing a layer of a precious metal.

10. The fine line circuitized substrate and chip carrier of claim 9 wherein said precious metal is selected from the group consisting of gold, platinum, palladium and rhodium.

11. The fine line circuitized substrate and chip carrier of claim 9 wherein said precious metal is gold.

12. The fine line circuitized substrate and chip carrier of claim 1 wherein said swelling agent is selected from the group consisting of butyl carbitol, ethylene glycol, N-methyl pyrrolidone and γ-butyrolactone.

13. The fine line circuitized substrate and chip carrier of claim 1 which further comprises treating said circuitized substrate with a reducing agent to neutralize alkaline material prior to said applying a metal layer.

14. The fine line circuitized substrate and chip carrier of claim 12 which further comprises carrying out a copper cleaning step prior to said applying a metal layer and after treating said circuitized substrate with said composition.

15. The fine line circuitized substrate and chip carrier of claim 1 wherein said circuitized substrate is provided by subtractive plating.

16. A multi-layered circuitized structure for use in highly dense cards, circuit boards and chip carriers wherein said circuitized substrate contains metal lines spaced about 28 microns apart obtained by the method comprising:
   providing a circuitized substrate comprising a circuitized portion and dielectric located between the circuitized portion;
   contacting said circuitized substrate with a swelling agent for treating said dielectric;
   contacting said circuitized substrate with a composition comprising at least one member selected from the group consisting of alkaline permanganate, chromate, and chlorite for treating said dielectric; and
   applying a metal layer on said treated circuitized substrate to coat the circuitized portion of said substrate.

17. The multi-layered circuitized structure of claim 16 wherein said circuitized substrate contains copper lines.

18. The multi-layered circuitized structure of claim 16 wherein said metal layer is provided by electrolessly depositing a nickel layer followed by electrolessly depositing a layer of a precious metal.

19. The multi-layered circuitized structure of claim 18 wherein said precious metal is selected from the group consisting of gold, platinum, palladium and rhodium.

20. The multi-layered circuitized structure of claim 18 wherein said precious metal is gold.

* * * * *